United States Patent [19]
Reindel

[11] 3,950,703
[45] Apr. 13, 1976

[54] MICROCIRCUIT REVERSE-PHASED HYBRID RING MIXER

[75] Inventor: John Reindel, San Diego, Calif.

[73] Assignee: The United States of America as represented by the Secretary of the Navy, Washington, D.C.

[22] Filed: Feb. 3, 1975

[21] Appl. No.: 546,368

[52] U.S. Cl. .............................. 325/446; 333/84 M
[51] Int. Cl.² ............................................ H04B 1/26
[58] Field of Search ............ 325/445, 446; 333/235, 333/84 M

[56] References Cited
UNITED STATES PATENTS

| | | | |
|---|---|---|---|
| 2,436,828 | 3/1948 | Ring | 325/446 |
| 2,854,645 | 9/1958 | Arditi | 333/84 M |
| 3,241,071 | 3/1966 | Alford | 325/445 |
| 3,506,932 | 4/1970 | Beurrier | 333/84 M |

*Primary Examiner*—George H. Libman
*Attorney, Agent, or Firm*—R. S. Sciascia; G. J. Rubens; H. Fendelman

[57] ABSTRACT

A balanced microcircuit mixer for down converting microwave and millimeter wave frequencies. A pair of beam lead diodes and an IF filter are mounted on a reverse-phased hybrid ring coupler providing a wide bandwidth mixer.

12 Claims, 5 Drawing Figures

MICROCIRCUIT REVERSE-PHASED HYBRID RING MIXER

CROSS REFERENCE TO RELATED APPLICATION

This application is related to co-pending application Ser. No. 546,369, filed on Feb. 3, 1975 by John Reindel entitled "Microstrip Reverse-Phased Hybrid Ring Coupler"

BACKGROUND OF THE INVENTION

Frequency converters or mixers as they are commonly called, can be classified as single ended, balanced or double balanced. A balanced mixer requires a hybrid device to isolate the local oscillator and the signal powers. A hybrid is a four port microwave circuit that evenly divides the signal that is applied to any of its ports and transfers the signals to two ports while the fourth port is isolated.

Microwave mixers operating above 18GHz have in the past used waveguide hybrid Tees or short slot hybrids. Other balanced waveguide mixers use a coaxial local oscillator feed from a side wall and two diodes across the broad walls of the waveguide as disclosed in U.S. Pat. No. 3,638,126. These devices have a limited bandwidth and are relatively difficult to manufacture and, therefore, expensive. Wide band coaxial or microcircuit hybrids have in the past not been successfully built at frequencies above 18GHz because the required performance characteristics could not be attained with conventional circuits that operate at lower frequencies.

SUMMARY OF THE INVENTION

The present invention relates to a device that can convert an EHF signal frequency to an intermediate frequency so that amplification at low noise levels can be economically achieved. The balanced microcircuit mixer of the present invention utilizes a reverse-phased hybrid ring coupler with two beam lead diodes connected to opposite terminals of the ring coupler and to a common capacitive disc in the center of the coupler. The disc is connected by an inductive wire and a second capacitive circuit pad to a coaxial connector. Local oscillator power is divided evenly by the two diodes. Signal power likewise is evenly divided but is 180° out of phase. The mixed products are added because the diodes are connected with opposite polarity to the common capacitive pad at the center of the ring. The low intermediate frequency signal is isolated from the RF ring coupler by a low pass filter consisting of the center pad, the inductive wire, and the second capacitive pad at the IF port. The invention disclosed herein provides an improved operational bandwidth and extends the upper frequency limit of prior coaxial or microcircuit mixers to over 40GHz, is easily manufactured and, therefore, lends itself readily to low production costs.

STATEMENT OF THE OBJECTS OF INVENTION

Accordingly, it is the primary object of the present invention to disclose a novel hybrid ring mixer.

It is a further object of the present invention to disclose a novel frequency converter.

It is a still further object of the present invention to disclose a novel microcircuit mixer.

Other objects, advantages and novel features of the invention will become apparent from the following detailed description of the invention when considered in conjunction with the accompanying drawings.

DESCRIPTION OF THE PREFERRED EMBODIMENT

Figure 1:
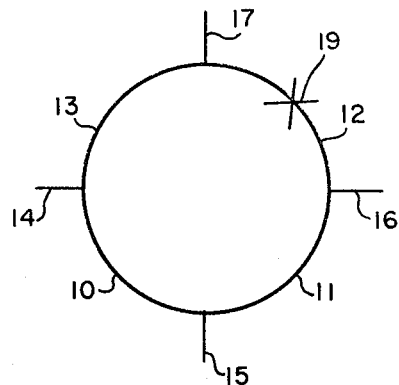
FIG. 1 is a schematic diagram of the reverse-phased coupler from which the present invention is constructed.
Figure 5:
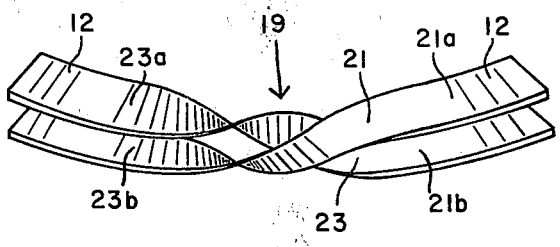
FIG. 5 is a perspective view of the 180° twisted pair of parallel transmission lines utilized in the present invention.

The balanced microcircuit mixer of the present invention is based upon the reverse-phased coupler illustrated schematically in FIG. 1 and described in detail in co-pending application, Ser. No. 546,369, by John Reindel, entitled "Microstrip Reverse Phase Hybrid Ring Coupler." The reverse-phased coupler is a transmission line microcircuit ring with four arms 10, 11, 12 and 13 and input-output port lines 14, 15, 16 and 17. At midband the arms 10, 11, 12 and 13 are a quarter wavelength long and have an impedance of $\sqrt{2}$ x the impedance of the input and output ports. One of the arms includes a parallel pair of transmission lines which are given a 180° phase twist 19 illustrated by the X in FIG. 1, and illustrated in detail in FIG. 5. The 180° phase twist 19 serves to isolate the input ports 15 and 17. Since the electrical path through arms 13 and 12 is 180° out of phase from the electrical path through arms 10 and 11 the fields at port 16 cancel and port 16 is thereby isolated from port 14.

Figure 2:
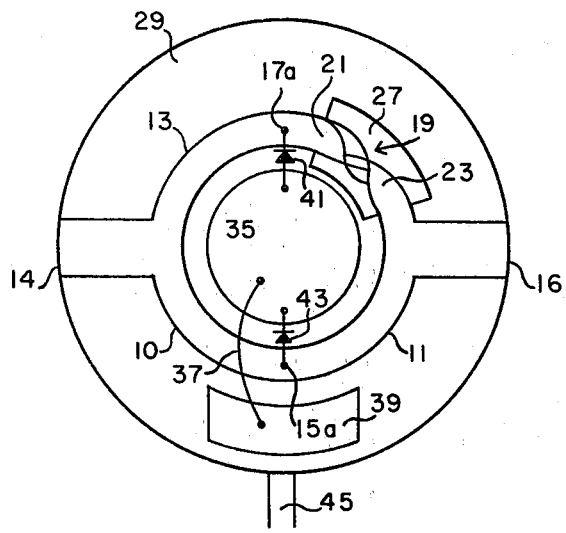
FIG. 2 is a top view of the mixer of the present invention.
Figure 3:
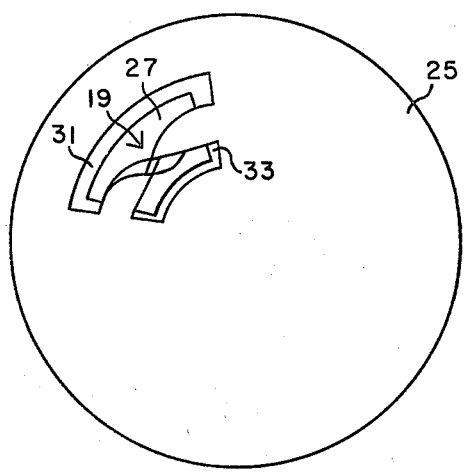
FIG. 3 is a bottom view of the mixer of the present invention.
Figure 4:
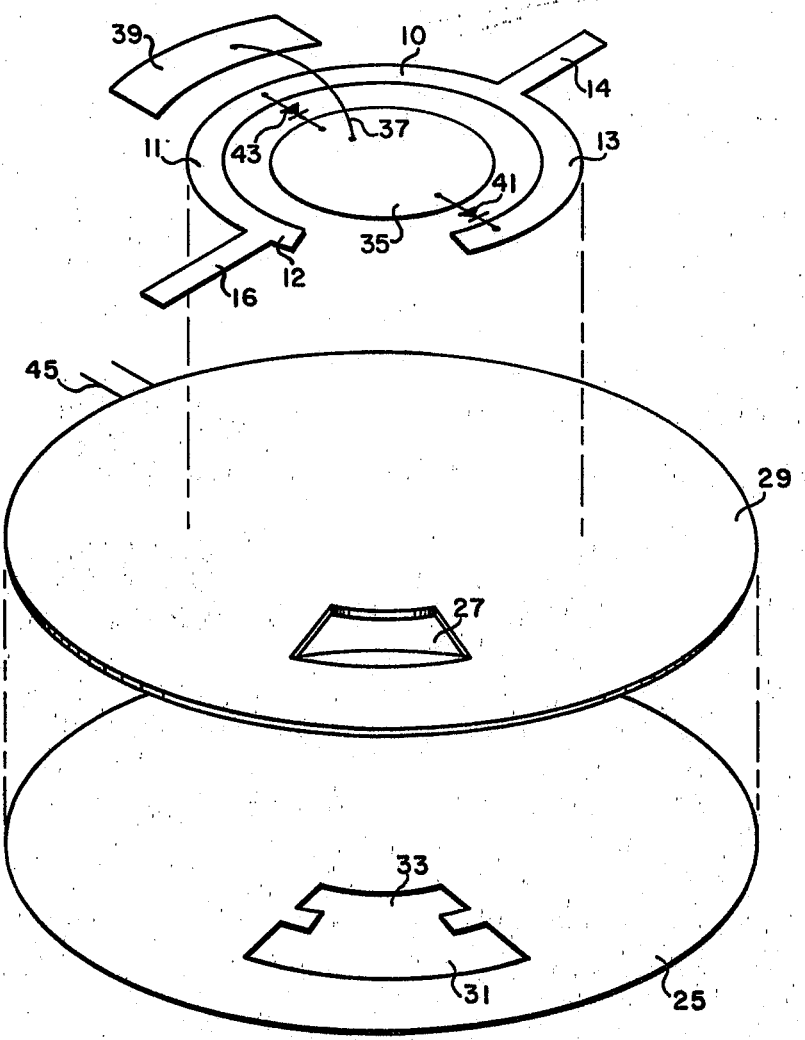
FIG. 4 is an exploded view of the mixer of the present invention.

Referring now to FIGS. 2, 3, 4 and 5 it is seen that the 180° phase twist 19 is constructed from two equal width, parallel conductive strips 21 and 23. Each of the strips has a first end 21a and 23a respectively, mechanically and electrically connected in the circuit arm 12. Both strips are twisted in the same direction 180° such that the strips remain parallel and equally spaced throughout their length and are connected at their other ends 21b and 23b to the ground plane 25, illustrated in detail in FIG. 3, through aperture 27 in dielectric laminate 29. As illustrated in FIGS. 3 and 4, ground plane 25 may be cut away in areas 31 and 33 to provide improved device performance.

As seen in FIGS. 2 and 4, capacitive circuit pad 35 is mounted by suitable techniques on dielectric 29, is located within the signal divider microcircuit and is connected by a conductive wire 37 functioning as an inductor which may, for example, be a gold wire to a second capacitive circuit pad 39 also suitably mounted on dielectric laminate 29. A first beam lead diode 41 has its anode connected to capacitive circuit pad 35 and its cathode connected to the juncture 17a of circuit arms 12 and 13 of the signal divider ring. A second beam lead diode 43 has its cathode connected to capacitive circuit pad 35 and its anode connected to the juncture 15a of circuit arms 10 and 11 of the signal divider rings. Local oscillator power provided at port 16 is divided evenly by the two diodes 41 and 43 connected at junctures 17a and 15a, respectively. Signal power applied at port 14 likewise is divided but is 180° out of phase. The mixed products are added because the diodes 41 and 43 are connected with opposite polarity to the common capacitive pad 35 at the center of the signal divider ring. The low intermediate frequency signal is isolated from the signal divider ring by a low-pass filter consisting of the center capacitive pad 35, the conductive wire 37 which functions as an inductor, and a second capacitive pad 39 at the IF port 45. The mixer is preferably provided with a suitable housing (not shown) into which ports 14, 16 and 45 may be press fit. Alternatively, any other suitable type of coaxial connector for providing access to the microcircuit may be provided.

The mixer of the present invention has a wide operating bandwidth, typically 2:1, is small in size and easy to fabricate. It is especially suitable for operation in the 18-16 and 26–40 GHz frequency bands since the circuit is printed on a dielectric substrate having a low dielectric constant, the circuit can be enclosed in a cavity of such a small dimension that moding is not feasible and the symmetry of the ring circuit and the low-pass filter pad and the placement of the beam-lead diodes assures a high degree of phase alignment.

Obviously many modifications and variations of the present invention are possible in the light of the above teachings. It is therefore to be understood that within the scope of the appended claims the invention may be practiced otherwise than as specifically described.

What is claimed is:

1. A frequency converter comprising:
   a dielectric material having first and second sides;
   a ground plane fixed to said dielectric material second side;
   a signal divider circuit fixed to said dielectric material first side having first and second inputs;
   said signal divider circuit including a phase reversal segment comprising first and second adjacent, substantially parallel conductors each having first and second sides and each being twisted 180°.

2. The converter of claim 1 including first and second capacitive pads fixed to said dielectric material first side, said capacitive pads being connected to said signal divider circuit.

3. The converter of claim 2 including first and second diodes connected between said signal divider circuit and said first capacitive pad.

4. The converter of claim 3 wherein said first diode has its anode connected to said first capacitive pad and said second diode has its cathode connected to said first capacitive pad.

5. The converter of claim 3 further including an inductor connected between said first and second capacitive pads.

6. The converter of claim 5 wherein said inductor consists of a conductive wire.

7. The converter of claim 5 wherein said first and second capacitive pads and said inductor function as an rf filter.

8. The converter of claim 3 wherein said first capacitive pad is positioned within said predetermined area.

9. The converter of claim 8 wherein said second capacitive pad is positioned outside said predetermined area.

10. The converter of claim 3 wherein said first and second conductors are oriented such that said first side of said first conductor faces said first side of said second conductor throughout the lengths of said conductors.

11. The converter of claim 3 wherein said signal divider circuit comprises a closed loop encompassing a predetermined area.

12. A frequency converter comprising:
    a dielectric material having first and second sides;
    a ground plane fixed to said dielectric material second side;
    a signal divider circuit fixed to said dielectric material first said having first and second inputs;
    said signal divider circuit including a phase reversal segment comprising first and second adjacent, substantially parallel conductors each having first and second sides and each being twisted 180°; and
    an IF filter connected to said signal divider circuit.

* * * * *

UNITED STATES PATENT OFFICE
CERTIFICATE OF CORRECTION

PATENT NO. : 3,950,703
DATED : April 13, 1976
INVENTOR(S) : John Reindel

It is certified that error appears in the above-identified patent and that said Letters Patent are hereby corrected as shown below:

| | | |
|---|---|---|
| Col. 4, | line 18, | claim "8" should read --10-- |
| | line 18, | "3" should read --9-- |
| | line 20, | claim "9" should read --11-- |
| | line 20, | "8" should read --10-- |
| | line 23, | claim "10" should read --8-- |
| | line 28, | claim "11" should read --9-- |
| | line 36, | "said" should read --side-- |

Signed and Sealed this

Twenty-first Day of September 1976

[SEAL]

Attest:

RUTH C. MASON
Attesting Officer

C. MARSHALL DANN
Commissioner of Patents and Trademarks